US011297746B2

(12) United States Patent
Otsubo et al.

(10) Patent No.: US 11,297,746 B2
(45) Date of Patent: Apr. 5, 2022

(54) HIGH-FREQUENCY MODULE

(71) Applicant: Murata Manufacturing Co., Ltd., Kyoto (JP)

(72) Inventors: Yoshihito Otsubo, Kyoto (JP); Yuta Morimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/919,949

(22) Filed: Jul. 2, 2020

(65) Prior Publication Data

US 2020/0337187 A1 Oct. 22, 2020

Related U.S. Application Data

(63) Continuation of application No. PCT/JP2018/047707, filed on Dec. 26, 2018.

(30) Foreign Application Priority Data

Jan. 5, 2018 (JP) .............................. JP2018-000442

(51) Int. Cl.
*H05K 9/00* (2006.01)
*H01L 23/12* (2006.01)
(Continued)

(52) U.S. Cl.
CPC ........... *H05K 9/0024* (2013.01); *H01L 23/12* (2013.01); *H01L 23/31* (2013.01); *H01L 23/66* (2013.01);
(Continued)

(58) Field of Classification Search
CPC .......... H05K 9/00; H05K 9/0015; H05K 3/28; H05K 3/284–185; H05K 1/02;
(Continued)

(56) References Cited

U.S. PATENT DOCUMENTS 8,897,019 B1 * 11/2014 Shimamura ............ H05K 9/003
361/728
9,070,793 B2 * 6/2015 Liao ...................... H01L 23/552
(Continued)

FOREIGN PATENT DOCUMENTS

CN 102054821 A 5/2011
CN 104347533 A 2/2015
(Continued)

OTHER PUBLICATIONS

International Search Report issued in Application No. PCT/JP2018/047707, dated Mar. 19, 2019.
(Continued)

*Primary Examiner* — Tuan T Dinh
(74) *Attorney, Agent, or Firm* — Pearne & Gordon LLP

(57) ABSTRACT

A high-frequency module (1a) includes a multilayer wiring substrate (2), a plurality of components (3a, 3b) mounted on an upper surface (20a) of the multilayer wiring substrate (2), a sealing resin layer (4) laminated on the upper surface (20a) of the multilayer wiring substrate (2) and sealing the plurality of components (3a, 3b), and a shield (5). The shield (5) is composed of shield walls (5a, 5b) arranged in grooves (12) and (13), respectively, formed between the first component (3a) and the second component (3b) in the sealing resin layer (4) and a connecting conductor (11) coupling both the shield walls (5a, 5b). A first region (40a) and a second region (40b) in the sealing resin layer (4) split by the shield (5) are contiguous at the location of the connecting conductor (11) as seen from a direction perpendicular to the upper surface (20a) of the multilayer wiring substrate (2).

15 Claims, 9 Drawing Sheets

(51) Int. Cl.
  *H01L 23/31* (2006.01)
  *H01L 23/66* (2006.01)
  *H05K 1/02* (2006.01)
  *H05K 3/28* (2006.01)

(52) U.S. Cl.
  CPC ............ *H05K 1/0213* (2013.01); *H05K 3/284* (2013.01); *H05K 2201/0715* (2013.01); *H05K 2203/107* (2013.01)

(58) Field of Classification Search
  CPC .. H05K 1/0243; H05K 1/0298; H05K 1/0213; H01L 23/12; H01L 23/31; H01L 23/66; H01L 23/552; H01L 23/3121; H01L 23/5383–5384
  USPC ............... 361/760–764, 767–784, 816, 818; 174/350, 520; 257/685–730
  See application file for complete search history.

(56) References Cited

U.S. PATENT DOCUMENTS

| | | | | |
|---|---|---|---|---|
| 10,424,545 | B2* | 9/2019 | Lin | .................. H01L 25/18 |
| 2006/0258050 | A1* | 11/2006 | Fujiwara | ............... H01L 23/552 |
| | | | | 438/112 |
| 2011/0304993 | A1* | 12/2011 | Takemura | ........... H01L 23/3121 |
| | | | | 361/736 |
| 2012/0320559 | A1 | 12/2012 | Kimura | |
| 2013/0271928 | A1* | 10/2013 | Shimamura | ............ H05K 3/284 |
| | | | | 361/748 |
| 2014/0160699 | A1* | 6/2014 | Zhang | ................... H01L 23/552 |
| | | | | 361/752 |
| 2014/0231972 | A1 | 8/2014 | Hsu et al. | |
| 2014/0293550 | A1 | 10/2014 | Mugiya et al. | |
| 2015/0043172 | A1 | 2/2015 | Mugiya et al. | |
| 2018/0092201 | A1 | 3/2018 | Otsubo et al. | |
| 2018/0092257 | A1 | 3/2018 | Otsubo et al. | |
| 2018/0204781 | A1 | 7/2018 | Otsubo | |
| 2018/0374798 | A1* | 12/2018 | Lee | ....... H01L 23/552 |

FOREIGN PATENT DOCUMENTS

| | | | |
|---|---|---|---|
| JP | 2011187677 A | | 9/2011 |
| JP | 2014203881 A | | 10/2014 |
| JP | 2015057803 A | | 3/2015 |
| JP | 2016213348 A | * | 12/2016 |
| WO | 2016181954 A1 | | 11/2016 |
| WO | 2016195026 A1 | | 12/2016 |
| WO | 2017047539 A1 | | 3/2017 |

OTHER PUBLICATIONS

Written Opinion issued in Application No. PCT/JP2018/047707, dated Mar. 19, 2019.

* cited by examiner

---PRIOR ART---

HIGH-FREQUENCY MODULE

This is a continuation of International Application No. PCT/JP2018/047707 filed on Dec. 26, 2018, which claims priority from Japanese Patent Application No. 2018-000442 filed on Jan. 5, 2018. The contents of these applications are incorporated herein by reference in their entireties.

BACKGROUND OF THE DISCLOSURE

Field of the Disclosure

The present disclosure relates to a high-frequency module including a sealing resin layer covering a plurality of components mounted on a wiring substrate and a shield wall for preventing mutual interference of noise between the components.

Description of the Related Art

A high-frequency module implemented in a mobile terminal device may include a shield layer for blocking electromagnetic waves. In one example of that type of high-frequency module, the shield layer may cover the surface of mold resin with which components mounted on a wiring substrate are covered.

Such a shield layer is disposed to block noise from the outside. If a plurality of components are mounted on the wiring substrate, there is a problem that noise arising from a component interferes with another component among the plurality of components. Therefore, in addition to the shield layer for noise from the outside, a shield wall for mutually blocking noise between the mounted components may be disposed. The shield wall may be formed by, for example, forming a groove in a resin layer by laser processing and filling the groove with a conductor, such as conductive paste. In that case, the laser light used in forming the groove may affect the wiring substrate, and it may cause a crack in the wiring substrate and may damage the wiring. To avoid that situation, a high-frequency module including a shield between components and capable of minimizing damage to a wiring substrate has been proposed.

One such example is described in Patent Document 1 and illustrated as a high-frequency module 100 in FIG. 17. In the high-frequency module 100, a plurality of electronic components 102a and 102b are mounted on an upper surface 101a of a circuit substrate 101, and the electronic components 102a and 102b are both sealed with a resin section 103. The resin section 103 has a groove 104 between both the electronic components 102a and 102b. In the groove 104, an exposed section 106 where a portion of a metal piece 105 is not covered with the resin section 103 and is exposed is present. The exposed section 106 and a shield conductor 107 formed on the surface of the resin section 103 are connected to each other, and thus the metal piece 105 functions as a shield wall between both the electronic components 102a and 102b.

Patent Document 1: Japanese Unexamined Patent Application Publication No. 2011-187677 (see paragraphs 0014 to 0021, FIG. 1, and the like)

BRIEF SUMMARY OF THE DISCLOSURE

The high-frequency module 100 described in Patent Document 1, however, has a structure in which the groove 104 divides the resin section 103 so that the resin section 103 is entirely divided into the region on the electronic component 102a side and the region on the electronic component 102b side. Therefore, the high-frequency module 100 has a reduced mechanical strength, and it may be warped by its production process or thermal stress.

The present disclosure is made in consideration of the above problem. It is an object of the present disclosure to provide a high-frequency module having a configuration that includes a groove formed in a sealing resin layer and a shield disposed between components, the high-frequency module capable of having an improved mechanical strength and reducing the occurrence of warpage with continuous shield walls arranged in two spaced grooves and connected by a connecting conductor without entirely dividing the sealing resin layer.

To achieve the above object, a high-frequency module according to the present disclosure includes a wiring substrate, a first component and a second component, a shield member, and a sealing resin layer. The first component and the second component are mounted on a principal surface of the wiring substrate. The shield member is arranged between the first component and the second component. The sealing resin layer is formed on the principal surface of the wiring substrate and seals the first component and the second component. The shield member includes a first shield wall arranged in a first groove formed in the sealing resin layer, a second shield wall arranged in a second groove formed in the sealing resin layer, the second groove spaced from the first groove, and a connecting conductor arranged on the principal surface of the wiring substrate and connecting a first end of the first shield wall and a first end of the second shield wall. The sealing resin layer includes a first region where the first component is sealed with the shield member and a second region where the second component is sealed therewith, and the first region and the second region are contiguous at a location of the connecting conductor.

According to that configuration, because the first groove and the second groove are not in contact with each other, the first region and the second region in the sealing resin layer are not entirely divided. Thus, degradation in mechanical strength caused by dividing the sealing resin layer can be suppressed, and the occurrence of warpage can be reduced.

The connecting conductor may include a pair of leg sections having first ends connected to the principal surface of the wiring substrate and standing on the principal surface and a bridge section bridging second ends of the pair of leg sections. According to that configuration, a metal pin and wire can be used as the connecting conductor.

A third component or a wiring electrode may be arranged between the pair of leg sections in the connecting conductor, and the connecting conductor may straddle the third component or the wiring electrode. According to that configuration, the shield wall between the components can straddle another component or the wiring electrode.

The connecting conductor may be made of a metal block. In that case, the metal block can be used as the connecting conductor.

As seen from a direction perpendicular to the principal surface of the wiring substrate, the shield member may include a bent section, and the connecting conductor may be arranged at the bent section. If the grooves for accommodating the shield walls are formed by, for example, laser processing or the like, when the grooves have the bent section, the laser scanning stops momentarily, and thus the length of the laser radiation time is extended. Accordingly, the energy of the laser light is more strongly exerted on the bent section than the other areas, and under the same laser condition, the damage to the wiring substrate is increased.

According to the above-described configuration, where the connecting conductor is arranged on each of the bent sections and the grooves are formed in a zigzag shape, damage to the substrate caused by laser light in forming the grooves can be avoided.

The high-frequency module may further include a first end conductor arranged on an edge of the principal surface of the wiring substrate and connected to a second end of the first shield wall and a second end conductor arranged on the edge of the principal surface of the wiring substrate and connected to a second end of the second shield wall.

For example, if the grooves for accommodating the shield walls are formed by laser processing, it is likely that a crack occurs in particular, in the edge of the wiring substrate. Consequently, according to that configuration, the first and second end conductors are arranged on the edge of the wiring substrate so that the first and second grooves do not reach the edge of the wiring substrate, and thus damage to the wiring substrate can be avoided.

A high-frequency module may include a wiring substrate, a first component and a second component, a shield member, and a sealing resin layer. The first component and the second component may be mounted on a principal surface of the wiring substrate. The shield member may be arranged between the first component and the second component and may surround the first component. The sealing resin layer may be formed on the principal surface of the wiring substrate and may seal the first component and the second component. The shield member may have a rectangular shape as seen from a direction perpendicular to the principal surface of the wiring substrate. The shield member may include four shield walls arranged in four grooves, respectively, the four grooves spaced from each other and formed along sides of the rectangular shape, and four connecting conductors arranged on the principal surface of the wiring substrate at four corner sections of the rectangular shape, respectively. The sealing resin layer may include a first region where the first component is sealed with the shield member and a second region where the second component is sealed therewith, and the first region and the second region may be contiguous at a location of each of the connecting conductors.

According to that configuration, the shield walls surrounding the component and not dividing the resin in the sealing resin layer can be formed.

A high-frequency module may include a wiring substrate, a first component and a second component, a shield member, and a sealing resin layer. The first component and the second component may be mounted on a principal surface of the wiring substrate. The shield member may be arranged between the first component and the second component. The sealing resin layer may be formed on the principal surface of the wiring substrate and may seal the first component and the second component. The shield member may include a shield wall arranged in a groove formed in the sealing resin layer, a third end conductor arranged on an edge of the principal surface of the wiring substrate and connected to a first end of the shield wall, and a fourth end conductor arranged on the edge of the principal surface of the wiring substrate and connected to a second end of the shield wall. The sealing resin layer may include a first region where the first component is sealed with the shield member and a second region where the second component is sealed therewith, and the first region and the second region may be contiguous at a location of each of the third end conductor and the fourth end conductor.

According to that configuration, even with the single shield wall, the shield between the components can be formed without dividing the resin in the sealing resin layer.

According to the present disclosure, the grooves for accommodating the shield walls functioning as the shield between the components are formed without dividing the sealing resin layer, the two shield walls arranged in the two grooves are connected by the connecting conductor, and thus the shield between the components can be disposed while the sealing resin layer is not entirely divided. Therefore, the mechanical strength of the module can be improved without degrading the function of the shield between the components, and this can lead to reduced warpage of the module.

DETAILED DESCRIPTION OF THE DISCLOSURE

First Embodiment

Figure 1:
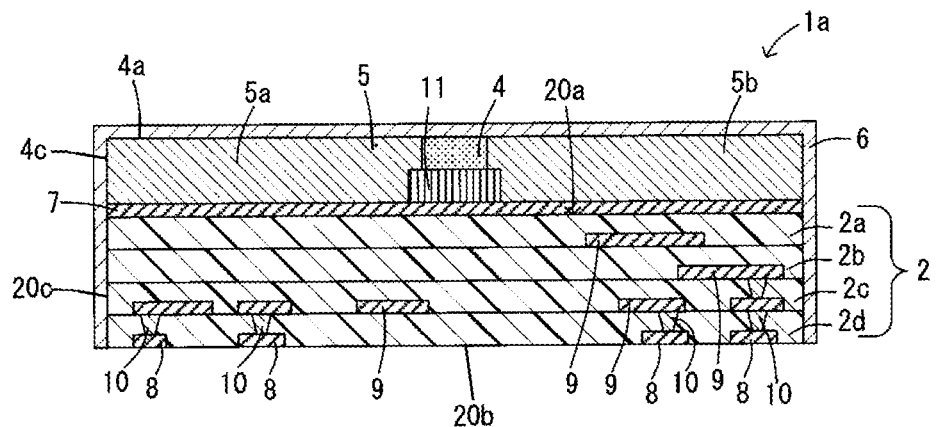
FIG. 1 is a cross-sectional view of a high-frequency module according to a first embodiment of the present disclosure taken along line A-A with arrows in FIG. 2.

A high-frequency module 1a according to a first embodiment of the present disclosure is described with reference to FIGS. 1 to 3B. FIG. 1 is a cross-sectional view of the high-frequency module 1a, FIG. 2 is a plan view of the high-frequency module 1a in a state where an upper surface of a shield film 6 and a sealing resin layer 4 are removed, and FIGS. 3A and 3B illustrate patterns of the shape of shield walls in the high-frequency module 1a in FIG. 1.

Figure 2:
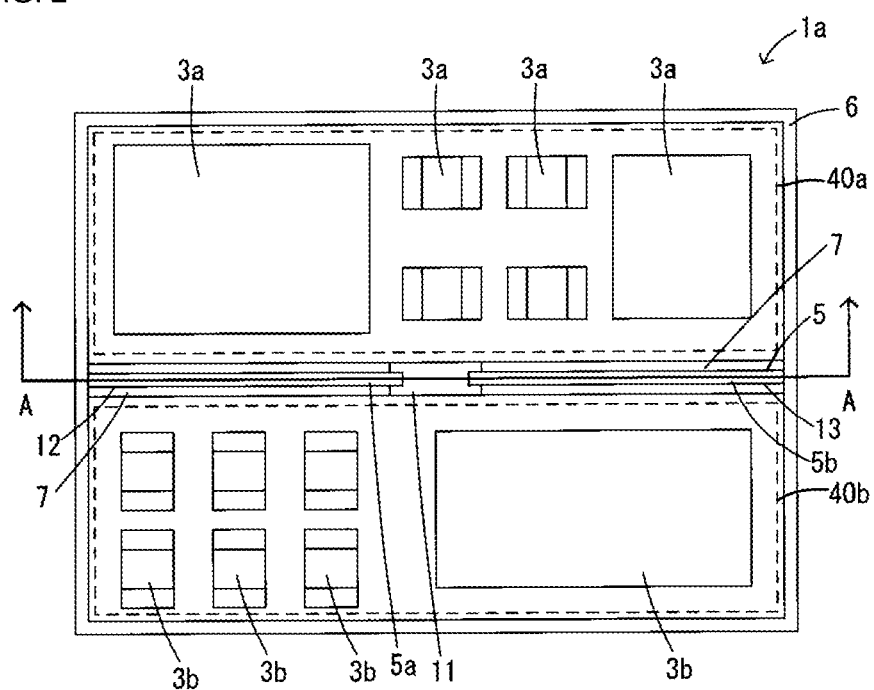
FIG. 2 is a plan view of the high-frequency module in FIG. 1 in a state where an upper surface of a shield film is removed.
Figure 3A:
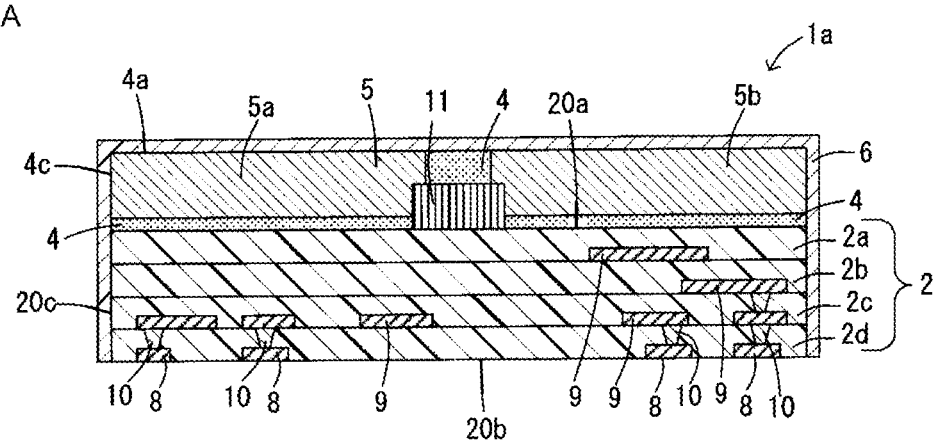
FIGS. 3A and 3B illustrate patterns of the shape of shield walls in FIG. 1.
Figure 3B:
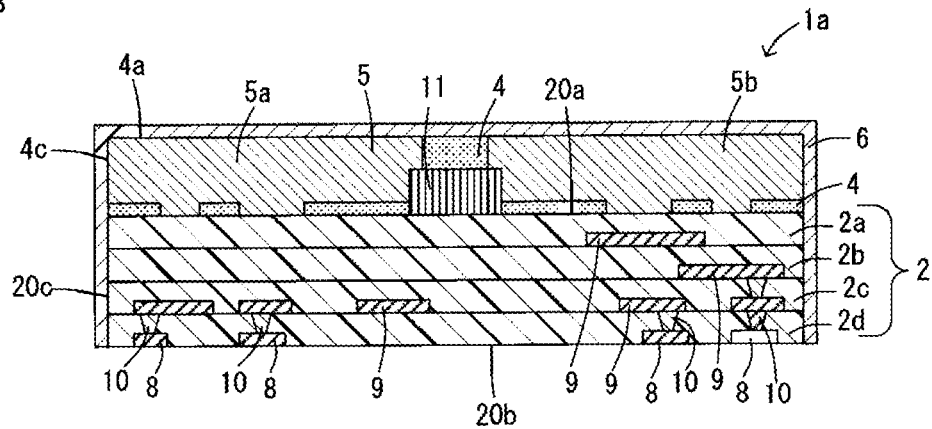

As illustrated in FIGS. 1 and 2, the high-frequency module 1a according to the present embodiment includes a multilayer wiring substrate 2 (corresponding to "wiring substrate" in the present disclosure), a first component 3a and a second component 3b mounted on an upper surface 20a of the multilayer wiring substrate 2, the sealing resin layer 4 laminated on the upper surface 20a of the multilayer wiring substrate 2, the shield film 6 covering the surface of the sealing resin layer 4, and a shield 5 (corresponding to "shield member" in the present disclosure) disposed in the sealing resin layer 4. The high-frequency module 1a may be implemented on, for example, a mother board or the like of an electronic apparatus that uses high-frequency signals.

The multilayer wiring substrate 2 may be a laminate of a plurality of insulating layers 2a to 2d made of, for example, a low-temperature co-fired ceramic material or glass epoxy resin. Mounting electrodes (not illustrated) for mounting the components 3a and 3b and a surface-layer electrode 7 connected to two shield walls 5a and 5b constituting the shield 5, as described below, are formed on the upper surface 20a of the multilayer wiring substrate 2 (corresponding to "principal surface of the wiring substrate in the present disclosure"), and a plurality of outer electrodes 8 for outer connection are formed on a lower surface 20b. In the present embodiment, various inner wiring electrodes 9 are arranged between neighboring ones of the insulating layers 2a to 2d. A plurality of via conductors 10 for connecting the inner wiring electrodes 9 formed on different ones of the insulating layers 2a to 2d are formed inside the multilayer wiring substrate 2. The surface-layer electrode 7 is connected to the inner wiring electrode 9 functioning as a ground electrode.

Each of the mounting electrodes, surface-layer electrode 7, outer electrodes 8, and inner wiring electrodes 9 is made of a metal that can be typically used as a wiring electrode, such as copper, silver, or aluminums. Each of the via conductors 10 is made of a metal, such as silver or copper. Each of the mounting electrodes, surface-layer electrode 7, and outer electrodes 8 may be coated with nickel and gold plating.

The first component 3a is configured as a semiconductor device made of a semiconductor, such as silicon or gallium arsenide, or a chip component, such as a chip inductor, a chip capacitor, or a chip resistor. When seen from a direction perpendicular to the upper surface 20a of the multilayer wiring substrate 2, the first component 3a is mounted in a position in a first region 40a in the sealing resin layer 4. The second component 3b is configured as a semiconductor device made of a semiconductor, such as silicon or gallium arsenide, or a chip component, such as a chip inductor, a chip capacitor, or a chip resistor. When seen from the direction perpendicular to the upper surface 20a of the multilayer wiring substrate 2, the second component 3b is mounted in a position in a second region 40b in the sealing resin layer 4.

The sealing resin layer 4 covers the upper surface 20a of the multilayer wiring substrate 2 and the components 3a and 3b and is laminated on the multilayer wiring substrate 2. The sealing resin layer 4 can be made of a resin that can be typically used as a sealing resin, such as an epoxy resin.

The shield film 6 is used for blocking noise from the outside to the various inner wiring electrodes 9 inside the multilayer wiring substrate 2 and the components 3a and 3b and covers an upper surface 4a and side surfaces 4c of the sealing resin layer 4 and side surfaces 20c of the multilayer wiring substrate 2. The shield film 6 can be formed as a multilayer structure including a close contact film laminated on the surface of the sealing resin layer 4, a conductive film laminated on the close contact film, and a protective film laminated on the conductive film.

The close contact film is disposed to enhance the strength of contact between the conductive film and the sealing resin layer 4 and can be made of, for example, a metal, such as stainless steel. The conductive film is a layer that virtually serves the shielding function of the shield film 6 and can be made of, for example, a metal selected among copper, silver, and aluminum. The protective film is disposed to prevent the conductive film from corrosion and scratches and can be made of, for example, stainless steel.

The shield 5 is arranged between the first component 3a and the second component 3b in the sealing resin layer 4 and is composed of two shield walls of the first shield wall 5a and the second shield wall 5b and a connecting conductor 11 connecting both the shield walls 5a and 5b. Specifically, as illustrated in FIG. 2, when seen from the direction perpendicular to the upper surface 20a of the multilayer wiring substrate 2, a first groove 12 and a second groove 13 are formed so as to partition the sealing resin layer 4 into two regions of the first region 40a and the second region 40b. By filling both the grooves 12 and 13 with conductive paste predominantly composed of a material, such as copper or silver, the shield walls 5a and 5b are formed. Both the grooves 12 and 13 are spaced so that they are not in contact with each other. Accordingly, both the shield walls 5a and 5b are also spaced so that they are not in contact with each other. The connecting conductor 11 is arranged so as to connect both the shield walls 5a and 5b, and the first shield wall 5a, the connecting conductor 11, and the second shield wall 5b constitute the continuous shield 5. Thus, the shield 5 separates the sealing resin layer 4 into the first region 40a and the second region 40b. The connecting conductor 11 is made of a metal in the shape of a block having a height smaller than that of the sealing resin layer 4, and the first region 40a and the second region 40b in the sealing resin layer 4 are contiguous above the connecting conductor 11. Here, the connecting conductor 11 can be fixed to a land electrode formed on the upper surface 20a of the multilayer wiring substrate 2, that land electrode can be electrically connected to a ground terminal, and thus the shield 5 can be connected to the ground. In that case, it is not necessary to connect the shield 5 and the inner electrodes exposed to the side surfaces 20c of the multilayer wiring substrate 2.

In the present embodiment, both the grooves 12 and 13 are formed by laser processing. During that processing, the surface-layer electrode 7 also performs the function of protecting the upper surface 20a of the multilayer wiring substrate 2 from damage caused by the laser. As illustrated in FIG. 3A, each of both the grooves 12 and 13 may be formed with a depth at which it does not reach the upper surface 20a of the multilayer wiring substrate 2. As illustrated in FIG. 3B, each of both the grooves 12 and 13 may be formed with a depth at which it reaches the upper surface 20a of the multilayer wiring substrate 2 in some areas and does not reach the upper surface 20a of the multilayer wiring substrate 2 in the other areas. In both the cases illustrated in FIGS. 3A and 3B, the first shield wall 5a and the second shield wall 5b are connected by the connecting conductor 11. The first region 40a and the second region 40b in the sealing resin layer 4 are contiguous above the connecting conductor 11. As illustrated in FIGS. 3A and 3B, when each of both the grooves 12 and 13 has a depth at which it does not reach the upper surface 20a, the surface-layer electrode 7 may not be formed.

Consequently, according to the above-described embodiment, because both the grooves 12 and 13 are not in contact with each other, both the shield walls 5a and 5b are also not in contact with each other, and the sealing resin layer 4 is not entirely divided. Thus, cracks of the sealing resin layer 4, degradation in mechanical strength of the high-frequency module 1a, and the occurrence of warpage thereof can be reduced. Because both the shield walls 5a and 5b are connected by the connecting conductor 11, they function as a single continuous shield as the shield arranged between the components. Each of both the grooves 12 and 13 has a depth at which it does not reach the upper surface 20a of the multilayer wiring substrate 2, and thus damage to the upper surface 20a of the multilayer wiring substrate 2 and damage to components adjacent to both the grooves 12 and 13 can be reduced. In addition, the top surface of the high-frequency module can easily provide a printable area.

(Variations of High-Frequency Module 1a)

Figure 4:
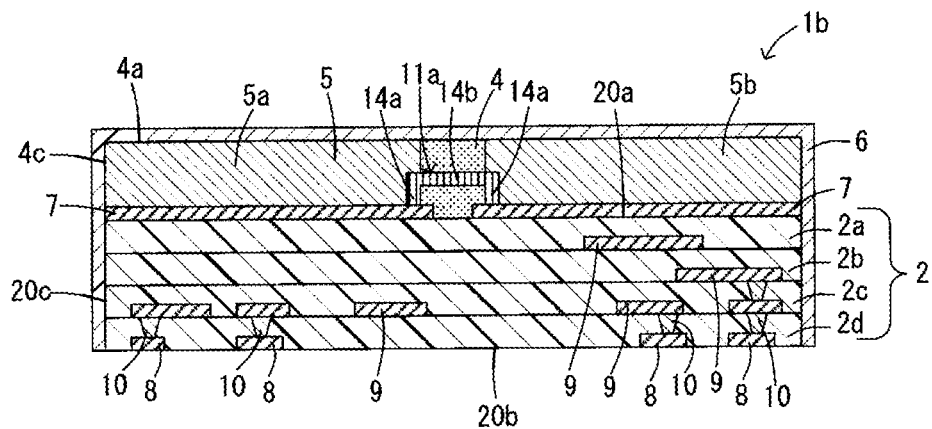
FIG. 4 illustrates a variation of the high-frequency module in FIG. 1 and is a cross-sectional view taken along line B-B with arrows in FIG. 5.
Figure 5:
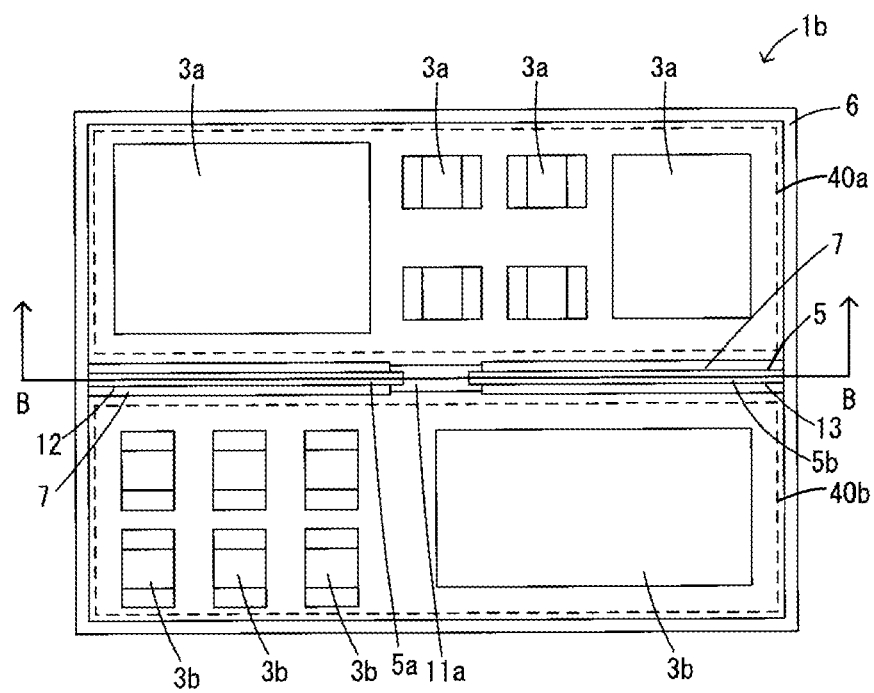
FIG. 5 is a plan view of the high-frequency module in FIG. 4 in a state where an upper surface of a shield film is removed.

In the above-described embodiment, the connecting conductor 11 is made of a metal in the shape of a block. In another example, as in a module 1b illustrated in FIGS. 4 and 5, a connecting conductor 11a may be made of a U-shaped metal pin or wire including a pair of leg sections 14a and a bridge section 14b bridging both the leg sections 14a. Both the leg sections 14a are connected to the surface-layer electrode 7, and the connecting conductor 11a stands on the upper surface 20a of the multilayer wiring substrate 2. In that configuration, because the connecting conductor 11a has the U shape, a wiring electrode can be arranged between both the leg sections 14a in the connecting conductor 11a.

Figure 6:
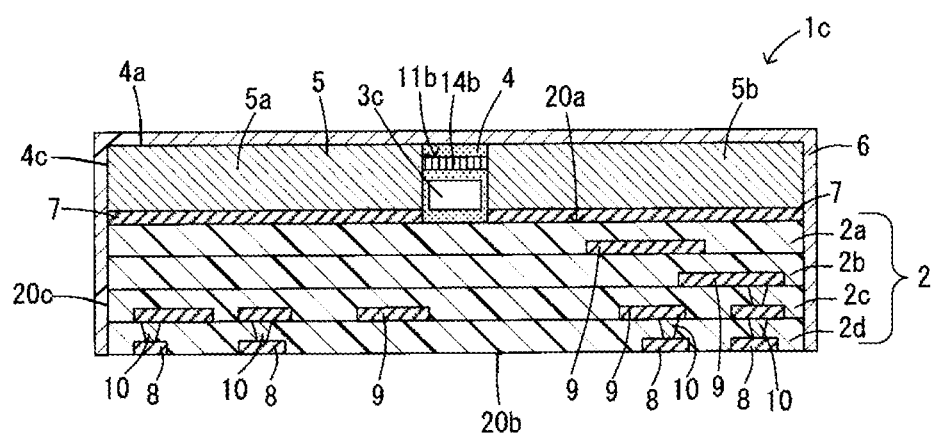
FIG. 6 illustrates another variation of the high-frequency module in FIG. 1 and is a cross-sectional view taken along line C-C with arrows in FIG. 7.
Figure 7:
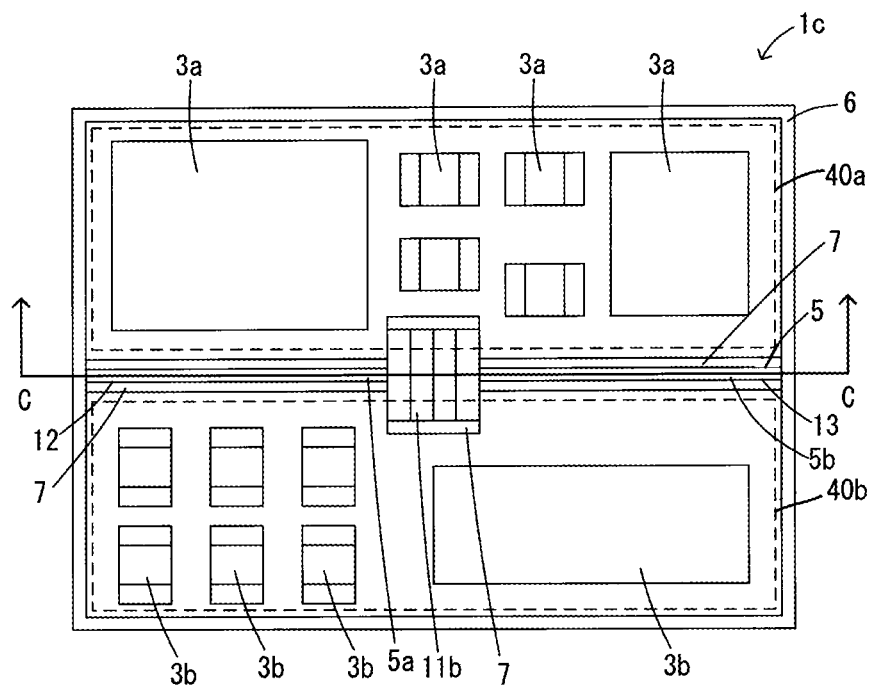
FIG. 7 is a plan view of the high-frequency module in FIG. 6 in a state where an upper surface of a shield film is removed.

In a module 1c illustrated in FIGS. 6 and 7, a connecting conductor 11b is the one in which a plurality of U-shaped metal pins or wires each including a pair of leg sections (not illustrated) and a bridge section 14b connecting both the leg sections are coupled. In the module 1b illustrated in FIGS. 4 and 5, the bridge section or a portion of the bridge section and the leg sections is connected to the first shield wall 5a and the second shield wall 5b. In the module 1c, neither of the leg sections is connected to the shield wall 5a or 5b, and the bridge section is connected to both the shield walls 5a and 5b. When seen from the direction perpendicular to the upper surface 20a of the multilayer wiring substrate 2, the connecting conductor 11b is arranged in a position where the bridge sections 14b are substantially orthogonal to both the shield walls 5a and 5b. In that configuration, a third component 3c can be arranged between both the leg sections in the connecting conductor 11b.

Second Embodiment

Figure 8:
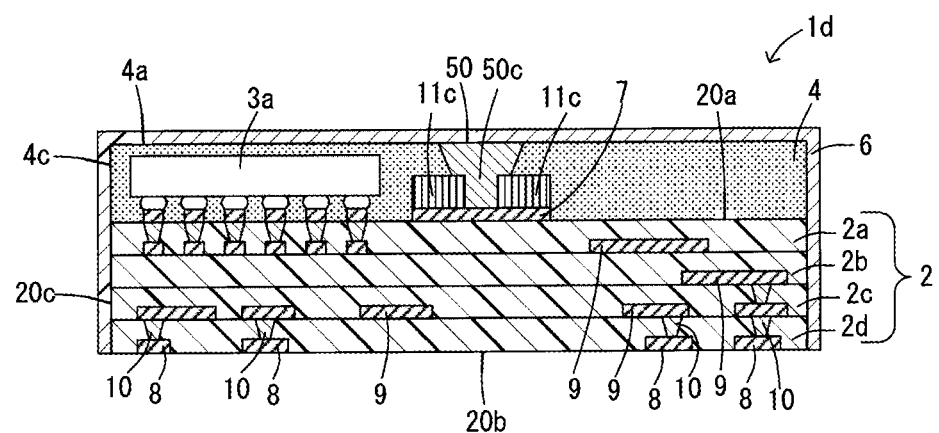
FIG. 8 is a cross-sectional view of a high-frequency module according to a second embodiment taken along line D-D with arrows in FIG. 9.
Figure 9:
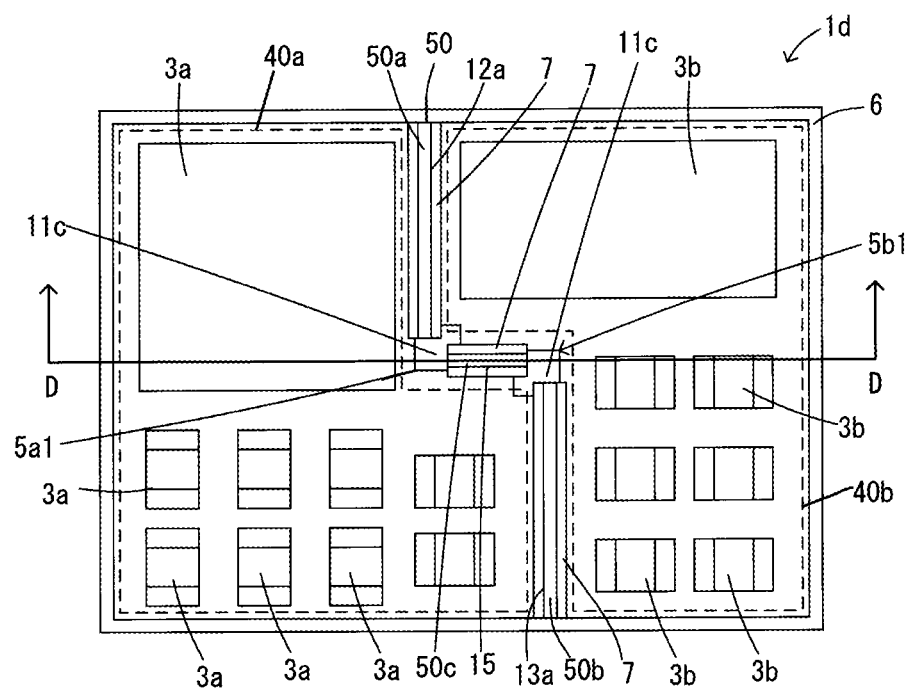
FIG. 9 is a plan view of the high-frequency module in FIG. 8 in a state where an upper surface of a shield film is removed.

A high-frequency module 1d according to a second embodiment of the present disclosure is described with reference to FIGS. 8 and 9. FIG. 8 is a cross-sectional view of the high-frequency module 1d. FIG. 9 is a plan view of the high-frequency module 1d in a state where the upper surface of the shield film 6 and the sealing resin layer 4 are removed.

The high-frequency module 1d according to the present embodiment differs from the high-frequency module 1a according to the first embodiment described with reference to FIGS. 1 to 3B in that the shield 5 has bent sections, as illustrated in FIGS. 8 and 9. Since the other configurations are the same as those of the high-frequency module 1a according to the first embodiment, the same reference numerals are used therein, and the description is omitted.

In the present embodiment, a shield 50 is composed of three shield walls 50a, 50b, and 50c and two connecting conductors 11c, and it has a zigzag shape including bent sections 5a1 and 5b1 as seen from the direction perpendicular to the upper surface 20a of the multilayer wiring substrate 2. Each of grooves 12a, 13a, and 15 for accommodating the shield walls 50a, 50b, and 50c, respectively, has a linear shape. At the bent section 5a1, the shield walls 50a and 50c are connected by one of the connecting conductors 11c, and at the bent section 5b1, the shield walls 50b and 50c are connected by the other connecting conductor 11c.

In forming the grooves for accommodating the shield walls by laser processing, because energy of the laser light is more strongly exerted on the bent sections 5a1 and 5b1 than on the other sections, the grooves are deeper under the same laser condition. Therefore, damage is likely to occur in the upper surface 20a of the multilayer wiring substrate 2 at the bent sections 5a1 and 5b1. In this configuration, however, the connecting conductors 11c are disposed at the bent sections 5a1 and 5b1, and thus the laser light is not exerted on the bent sections for a long time. Therefore, no damage occurs in the upper surface 20a of the multilayer wiring substrate 2, and the shield 50 can be formed without narrowing the region where components can be arranged.

(Variation of High-Frequency Module 1d)

Figure 10:
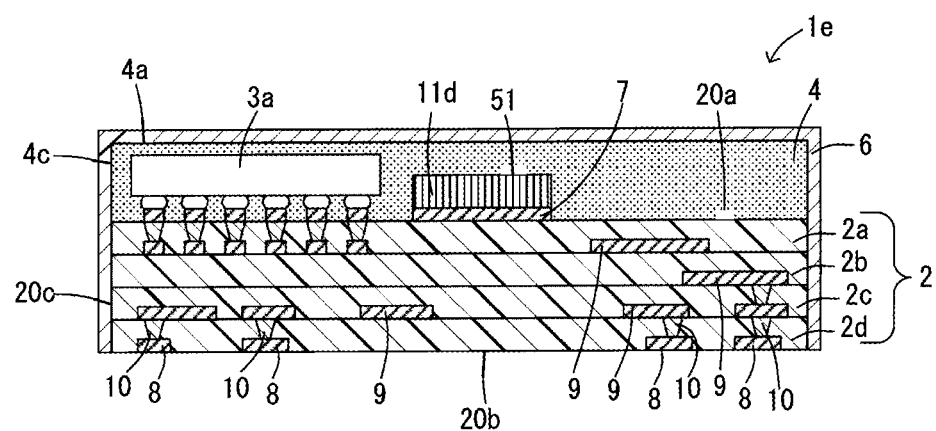
FIG. 10 illustrates a variation of the high-frequency module in FIG. 8 and is a cross-sectional view taken along line E-E with arrows in FIG. 11.
Figure 11:
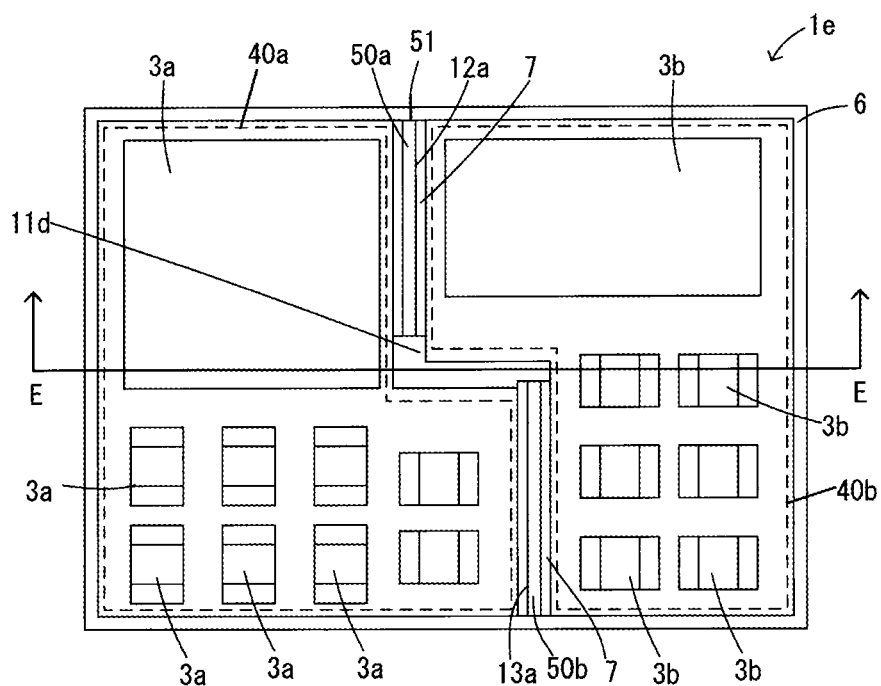
FIG. 11 is a plan view of the high-frequency module in FIG. 10 in a state where an upper surface of a shield film is removed.

In the above-described embodiment, the three shield walls 50a, 50b, and 50c and the two connecting conductors 11c constitute the shield 50. As in a high-frequency module 1e illustrated in FIGS. 10 and 11, a shield 51 including the bent sections 5a1 and 5b1 may be composed of the two grooves 12a and 13a and a single connecting conductor 11d. The shield 51 including the bent sections 5a1 and 5b1 can be formed by arranging the connecting conductor 11d in the position corresponding to the shield wall 50c in the high-frequency module 1d illustrated in FIGS. 8 and 9, instead of the groove and shield wall.

Third Embodiment

Figure 12:
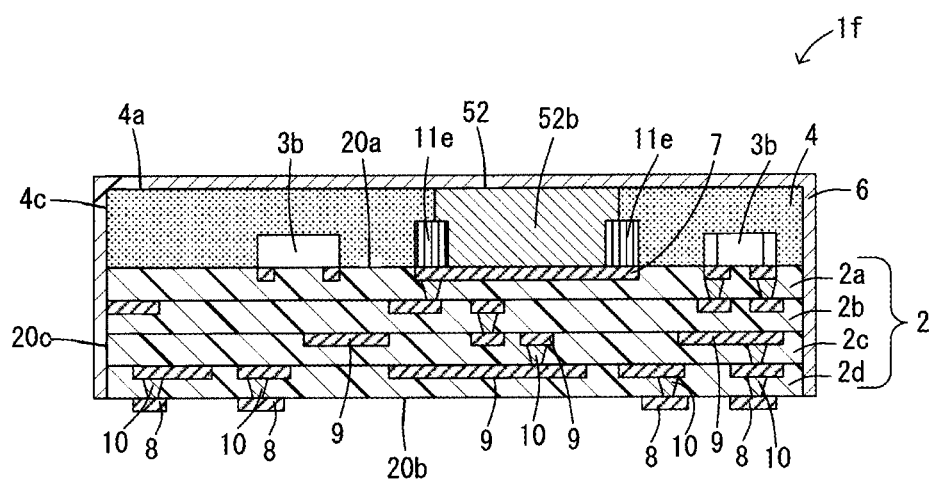
FIG. 12 is a cross-sectional view of a high-frequency module according to a third embodiment taken along line F-F with arrows in FIG. 13.
Figure 13:
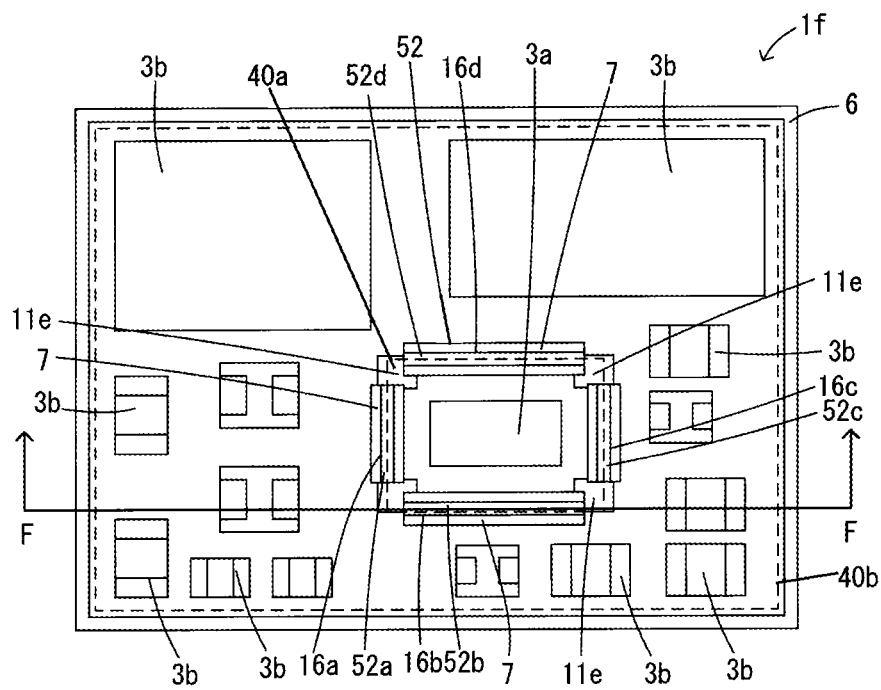
FIG. 13 is a plan view of the high-frequency module in FIG. 12 in a state where an upper surface of a shield film is removed.

A high-frequency module 1f according to a third embodiment of the present disclosure is described with reference to FIGS. 12 and 13. FIG. 12 is a cross-sectional view of the high-frequency module 1f. FIG. 13 is a plan view of the high-frequency module 1f in a state where the upper surface of the shield film 6 and the sealing resin layer 4 are removed.

The high-frequency module 1f according to the present embodiment differs from the high-frequency module 1a according to the first embodiment described with reference to FIGS. 1 to 3B in that a shield 52 surrounds the first component 3a, as illustrated in FIGS. 12 and 13. Since the other configurations are the same as those of the high-frequency module 1a according to the first embodiment, the same reference numerals are used therein, and the description is omitted.

In the present embodiment, the shield 52 is composed of four shield walls 52a to 52d and four connecting conductors 11e and has a rectangular shape. The first component 3a is arranged inside the rectangular shield 52. Four grooves 16a to 16d disposed in the sealing resin layer 4 are spaced away from each other so as not to be in contact with each other and are formed along the sides of the rectangular shape. By filling the grooves 16a to 16d with conductive paste predominantly composed of copper, silver, or the like, the shield walls 52a to 52d are arranged. The connecting conductors 11e are arranged at the four corner sections of the rectangular shape, and the rectangular shield 52 is formed.

According to that configuration, the shield arranged between components having various shapes can be formed by utilizing the combination of the plurality of shield walls and the plurality of connecting conductors.

Fourth Embodiment

Figure 14:
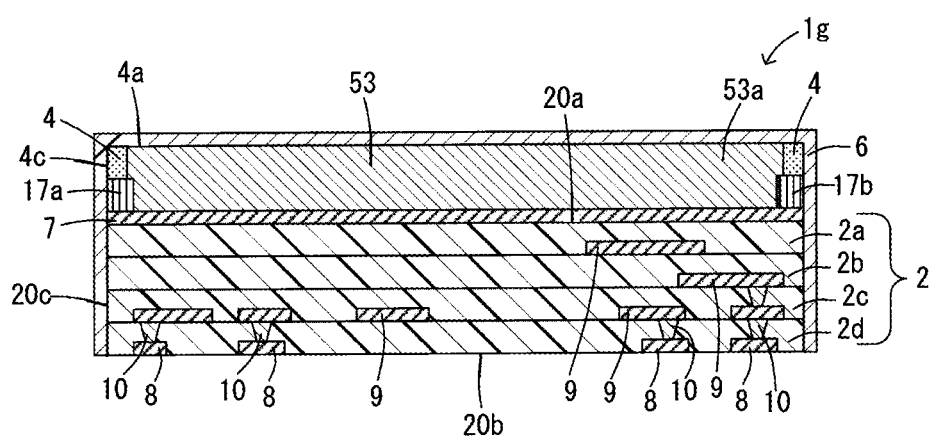
FIG. 14 is a cross-sectional view of a high-frequency module according to a fourth embodiment taken along line G-G with arrows in FIG. 15.
Figure 15:
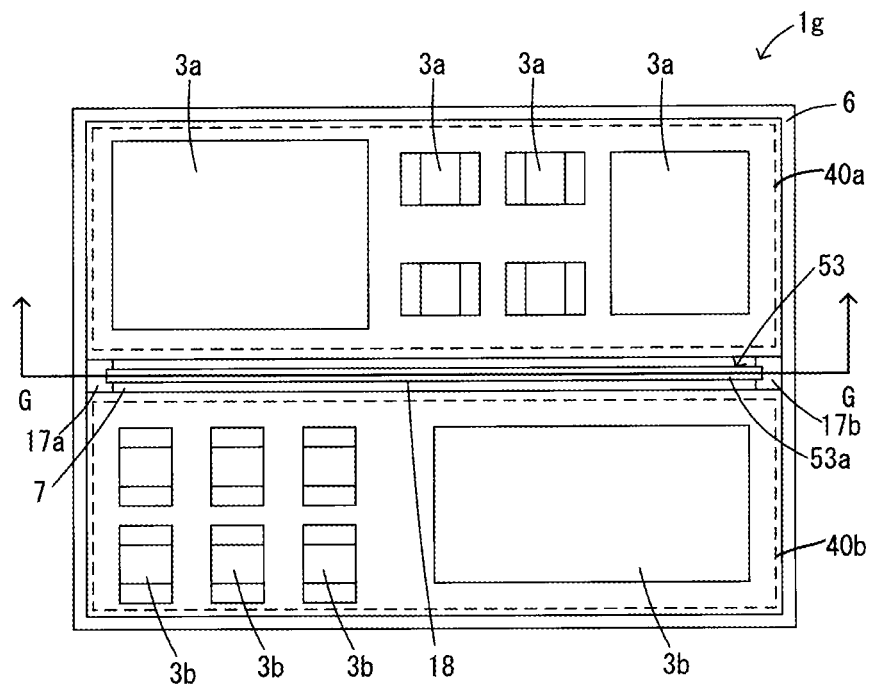
FIG. 15 is a plan view of the high-frequency module in FIG. 14 in a state where an upper surface of a shield film is removed.

A high-frequency module 1g according to a fourth embodiment of the present disclosure is described with reference to FIGS. 14 and 15. FIG. 14 is a cross-sectional view of the high-frequency module 1g. FIG. 15 is a plan view of the high-frequency module 1g in a state where the upper surface of the shield film 6 and the sealing resin layer 4 are removed.

The high-frequency module 1g according to the present embodiment differs from the high-frequency module 1a according to the first embodiment described with reference to FIGS. 1 to 3B in that a shield 53 is composed of a single shield wall and two end conductors 17a and 17b formed on an edge of the upper surface 20a of the multilayer wiring substrate 2, as illustrated in FIGS. 14 and 15. Since the other configurations are the same as those of the high-frequency module 1a according to the first embodiment, the same reference numerals are used therein, and the description is omitted.

In the present embodiment, the shield 53 is composed of a shield wall 53a and the end conductors 17a and 17b (corresponding to "third end conductor" and "fourth end conductor" in the present disclosure) formed on the edge of the upper surface 20a of the multilayer wiring substrate 2. The shield wall 53a is formed by filling a groove 18 formed in the sealing resin layer 4 with conductive paste predominantly composed of copper, silver, or the like.

According to the above-described embodiment, even with the single shield wall 53a, because it is connected to the two end conductors 17a and 17b arranged on the edge of the upper surface 20a of the multilayer wiring substrate 2, the shield 53 between the first component 3a and the second component 3b can be configured without entirely dividing the sealing resin layer 4.

(Variation of High-Frequency Module 1g)

Figure 16:
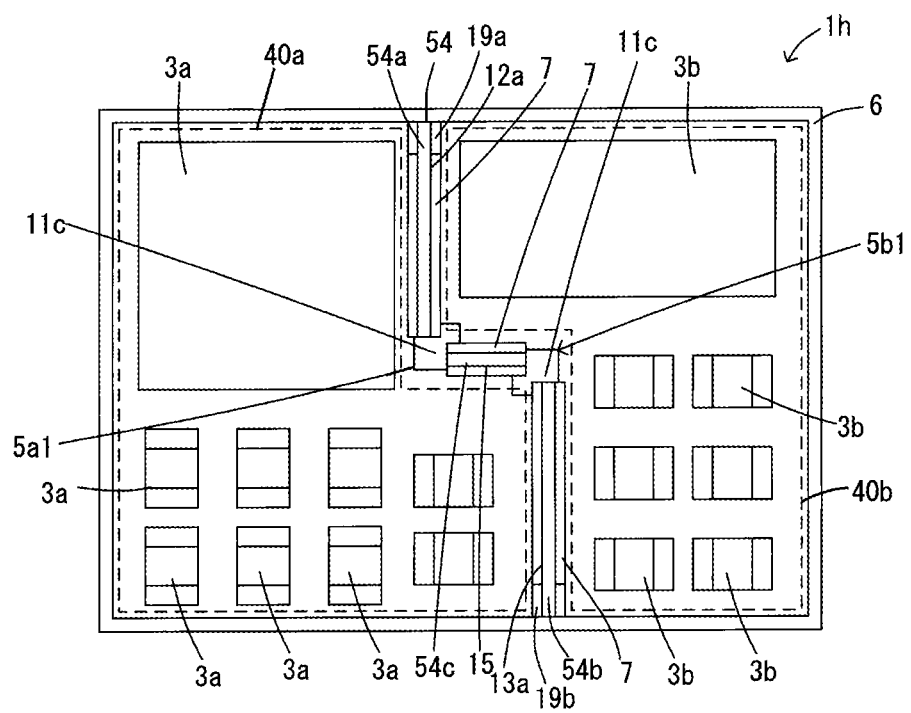
FIG. 16 illustrates a variation of the high-frequency module in FIG. 14.
Figure 17:
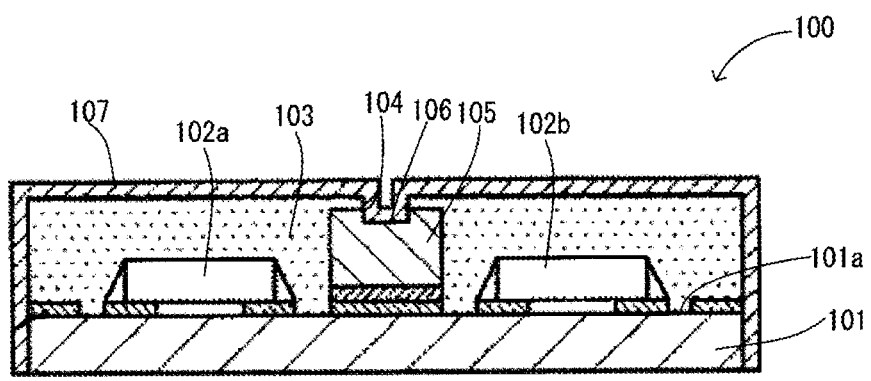
FIG. 17 is a cross-sectional view of a high-frequency module in related art.

As in a high-frequency module 1h illustrated in FIG. 16, a shield 54 may be composed of two or more shield walls, one or more connecting conductors, and two end conductors. The shield 54 is composed of three shield walls 54a, 54b, and 54c arranged by filling the three grooves 12a, 13a, and 15 with conductive paste predominantly composed of copper, silver, or the like, the two connecting conductors 11c, and two end conductors 19a and 19b (corresponding to "first end conductor" and "second end conductor" in the present disclosure).

In that configuration, because the end conductors 19a and 19b can be arranged on the edge of the upper surface 20a of the multilayer wiring substrate 2, the edge being more susceptible to laser than the other sections in forming the grooves 12a and 13a, damage to the multilayer wiring substrate 2 can be avoided.

The present disclosure is not limited to the above-described embodiments, and various changes other than the above-described ones can be made as long as they do not depart from its spirit. For example, the configurations in the above-described embodiments and variations may be combined.

The term "on" used herein includes when elements are in direct contact with each other and when another element is present between elements.

The present disclosure is applicable to various high-frequency modules including a sealing resin layer covering components mounted on a wiring substrate and a shield wall for preventing mutual interference of noise between the components.

1a to 1h high-frequency module
2 multilayer wiring substrate (wiring substrate)
3a, 3b component (first component, second component)
3c third component
4 sealing resin layer
5, 50 to 54 shield (shield member)
5a, 5b, 50a to 50c, 52a to 52d, 53a, 54a to 54c shield wall
5a1, 5b1 bent section
11, 11a to 11e connecting conductor
12, 13, 12a, 13a, 15, 16a to 16d groove
17a, 17b end conductor (third end conductor, fourth end conductor)
19a, 19b end conductor (first end conductor, second end conductor)
40a first region
40b second region

The invention claimed is:

1. A high-frequency module comprising:
a wiring substrate;
a first component and a second component mounted on a principal surface of the wiring substrate;
a shield member arranged between the first component and the second component; and
a sealing resin layer provided on the principal surface of the wiring substrate and sealing the first component and the second component,
wherein the shield member includes
a first shield wall arranged in a first groove provided in the sealing resin layer,
a second shield wall arranged in a second groove provided in the sealing resin layer, the second groove spaced from the first groove, and
a connecting conductor arranged on the principal surface of the wiring substrate and connecting a first end of the first shield wall and a first end of the second shield wall,
the sealing resin layer is divided into a first region and a second region, the first component is sealed with the shield member in the first region, the second component is sealed with the shield member in the second region, and the first region and the second region are contiguous at a location of the connecting conductor,
wherein the first shield wall and the second shield wall are spaced and are not in contact with each other.

2. The high-frequency module according to claim 1, wherein the connecting conductor includes a pair of leg sections and a bridge section, the pair of leg sections have first ends connected to the principal surface of the wiring substrate and stand on the principal surface, and the bridge section bridges second ends of the pair of leg sections.

3. The high-frequency module according to claim 2, wherein a third component or a wiring electrode is arranged between the pair of leg sections in the connecting conductor, and the connecting conductor straddles the third component or the wiring electrode.

4. The high-frequency module according to claim 1, wherein the connecting conductor is comprised of a metal block.

5. The high-frequency module according to claim 1, wherein as seen from a direction perpendicular to the principal surface of the wiring substrate, the shield member includes a bent section, and the connecting conductor is arranged at the bent section.

6. The high-frequency module according to claim 1, further comprising:
   a first end conductor arranged on an edge of the principal surface of the wiring substrate and connected to a second end of the first shield wall; and
   a second end conductor arranged on the edge of the principal surface of the wiring substrate and connected to a second end of the second shield wall.

7. A high-frequency module comprising:
   a wiring substrate;
   a first component and a second component mounted on a principal surface of the wiring substrate;
   a shield member arranged between the first component and the second component and surrounding the first component; and
   a sealing resin layer provided on the principal surface of the wiring substrate and sealing the first component and the second component,
   wherein the shield member has a rectangular shape as seen from a direction perpendicular to the principal surface of the wiring substrate,
   the shield member includes
      four shield walls arranged in four grooves, respectively, the four grooves spaced from each other and provided along sides of the rectangular shape, and
      four connecting conductors arranged on the principal surface of the wiring substrate at four corner sections of the rectangular shape, respectively,
   the sealing resin layer is divided into a first region and a second region, the first component is sealed with the shield member in the first region, the second component is sealed with the shield member in the second region, and the first region and the second region are contiguous at a location of each of the connecting conductors,
   wherein the shield walls are spaced and are not in contact with each other.

8. A high-frequency module comprising:
   a wiring substrate;
   a first component and a second component mounted on a principal surface of the wiring substrate;
   a shield member arranged between the first component and the second component; and
   a sealing resin layer provided on the principal surface of the wiring substrate and sealing the first component and the second component,
   wherein the shield member includes
      a shield wall arranged in a groove provided in the sealing resin layer,
      a third end conductor arranged on an edge of the principal surface of the wiring substrate and connected to a first end of the shield wall, and
      a fourth end conductor arranged on the edge of the principal surface of the wiring substrate and connected to a second end of the shield wall,
   the sealing resin layer is divided into a first region and a second region, the first component is sealed with the shield member in the first region, the second component is sealed with the shield member in the second region, and the first region and the second region are integrally connected to each other at a location of each of the third end conductor and the fourth end conductor.

9. The high-frequency module according to claim 2, wherein as seen from a direction perpendicular to the principal surface of the wiring substrate, the shield member includes a bent section, and the connecting conductor is arranged at the bent section.

10. The high-frequency module according to claim 3, wherein as seen from a direction perpendicular to the principal surface of the wiring substrate, the shield member includes a bent section, and the connecting conductor is arranged at the bent section.

11. The high-frequency module according to claim 4, wherein as seen from a direction perpendicular to the principal surface of the wiring substrate, the shield member includes a bent section, and the connecting conductor is arranged at the bent section.

12. The high-frequency module according to claim 2, further comprising:
   a first end conductor arranged on an edge of the principal surface of the wiring substrate and connected to a second end of the first shield wall; and
   a second end conductor arranged on the edge of the principal surface of the wiring substrate and connected to a second end of the second shield wall.

13. The high-frequency module according to claim 3, further comprising:
   a first end conductor arranged on an edge of the principal surface of the wiring substrate and connected to a second end of the first shield wall; and
   a second end conductor arranged on the edge of the principal surface of the wiring substrate and connected to a second end of the second shield wall.

14. The high-frequency module according to claim 4, further comprising:
   a first end conductor arranged on an edge of the principal surface of the wiring substrate and connected to a second end of the first shield wall; and
   a second end conductor arranged on the edge of the principal surface of the wiring substrate and connected to a second end of the second shield wall.

15. The high-frequency module according to claim 5, further comprising:
   a first end conductor arranged on an edge of the principal surface of the wiring substrate and connected to a second end of the first shield wall; and
   a second end conductor arranged on the edge of the principal surface of the wiring substrate and connected to a second end of the second shield wall.

* * * * *

UNITED STATES PATENT AND TRADEMARK OFFICE
CERTIFICATE OF CORRECTION

PATENT NO. : 11,297,746 B2
APPLICATION NO. : 16/919949
DATED : April 5, 2022
INVENTOR(S) : Yoshihito Otsubo et al.

It is certified that error appears in the above-identified patent and that said Letters Patent is hereby corrected as shown below:

In the Specification

Column 8, Line 51, "if" should be -- 1f --.

Column 8, Line 55, "if" should be -- 1f --.

Column 8, Line 57, "if" should be -- 1f --.

Signed and Sealed this
Thirty-first Day of January, 2023

*Katherine Kelly Vidal*

Katherine Kelly Vidal
*Director of the United States Patent and Trademark Office*